US009582613B2

United States Patent
Huang et al.

(10) Patent No.: US 9,582,613 B2
(45) Date of Patent: *Feb. 28, 2017

(54) MASSIVE MODEL VISUALIZATION WITH SPATIAL RETRIEVAL

(75) Inventors: Jianbing Huang, Shoreview, MN (US); Guy Roetcisoender, Mosier, OR (US); Balaji Venkatasubramaniam, Maharashtra (IN); Jeremy S. Bennett, Ames, IA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 537 days.

This patent is subject to a terminal disclaimer.

(21) Appl. No.: 13/606,574

(22) Filed: Sep. 7, 2012

(65) Prior Publication Data
US 2013/0132373 A1 May 23, 2013

(30) Foreign Application Priority Data

Nov. 23, 2011 (IN) .......................... 1486/KOL/2011

(51) Int. Cl.
G06F 17/30 (2006.01)
G06F 17/50 (2006.01)
(Continued)

(52) U.S. Cl.
CPC ........ G06F 17/50 (2013.01); G06F 17/30672 (2013.01); G06F 17/30713 (2013.01);
(Continued)

(58) Field of Classification Search
None
See application file for complete search history.

(56) References Cited

U.S. PATENT DOCUMENTS 4,862,376 A * 8/1989 Ferriter .................. G06F 17/50
700/107
6,057,847 A 5/2000 Jenkins
(Continued)

FOREIGN PATENT DOCUMENTS

EP 1 804 187 A2 7/2007
EP 2 261 827 A1 12/2010

OTHER PUBLICATIONS

W.C. Regli, et al., "Managing digital libraries for computer-aided design", 2000, ElSevier, Computer-Aided Design, vol. 32, pp. 119-132.*

(Continued)

*Primary Examiner* — Farhan Syed

(57) ABSTRACT

Systems and methods for massive model visualization in product data management (PDM) systems. A method includes storing a hierarchical product data structure by a product data management (PDM) system, including a plurality of occurrence nodes and component nodes. The method includes receiving a query that references an occurrence node and at least one cell index value and determining a query result corresponding to the query. The query result identifies at least one occurrence node that corresponds to the cell index value. The method includes forming a query result chain corresponding to the query result, the query result chain filtered by a structural criterion, and applying a configuration rule to the filtered query result chain to identify child nodes of the filtered query result chain that conform to the configuration rule, and thereby producing a configured spatial retrieval result.

18 Claims, 6 Drawing Sheets

(51) Int. Cl.
    *G06T 17/00* (2006.01)
    *G06T 15/00* (2011.01)
    *G06T 19/00* (2011.01)

(52) U.S. Cl.
    CPC ...... *G06F 17/30994* (2013.01); *G06T 15/005* (2013.01); *G06T 17/005* (2013.01); *G06T 19/00* (2013.01); *G06T 2200/16* (2013.01)

(56) References Cited

U.S. PATENT DOCUMENTS

| | | | |
|---|---|---|---|
| 6,118,456 A * | 9/2000 | Cooper | G06T 15/40 345/619 |
| 6,377,263 B1 | 4/2002 | Falacara et al. | |
| 6,898,560 B1 | 5/2005 | Das | |
| 6,933,946 B1 * | 8/2005 | Silva | G06T 1/60 345/582 |
| 7,127,308 B2 | 10/2006 | Bigelow | |
| 7,583,263 B2 * | 9/2009 | Huang | G06T 15/40 345/420 |
| 7,617,444 B2 | 11/2009 | Rothschillwe et al. | |
| 8,725,763 B2 * | 5/2014 | Huang | G06F 17/50 707/769 |
| 9,053,254 B2 * | 6/2015 | Carter | G06F 17/50 |
| 2002/0004710 A1 | 1/2002 | Murao | |
| 2002/0035463 A1 | 3/2002 | Lynch et al. | |
| 2002/0162081 A1 * | 10/2002 | Solomon | G06F 17/5068 716/119 |
| 2002/0184246 A1 | 12/2002 | Shkolnik | |
| 2004/0117393 A1 | 6/2004 | DeMesa et al. | |
| 2004/0210546 A1 * | 10/2004 | Spooner | G06T 7/0004 706/45 |
| 2005/0071135 A1 | 3/2005 | Vredenburgh et al. | |
| 2005/0223320 A1 | 10/2005 | Brintzenhofe et al. | |
| 2006/0074609 A1 | 4/2006 | Freeman et al. | |
| 2006/0098009 A1 * | 5/2006 | Zuniga | G06F 17/30961 345/421 |
| 2006/0173873 A1 * | 8/2006 | Prompt | G06F 17/30569 |
| 2007/0013709 A1 | 1/2007 | Charles et al. | |
| 2007/0159480 A1 * | 7/2007 | Delarue | G06F 3/0482 345/427 |
| 2008/0077365 A1 | 3/2008 | Fukumura | |
| 2008/0183730 A1 * | 7/2008 | Enga | G06F 17/30241 |
| 2008/0184185 A1 | 7/2008 | Saelzer et al. | |
| 2009/0016598 A1 | 1/2009 | Lojewski | |
| 2009/0106530 A1 * | 4/2009 | Lauterbach | G06T 15/40 712/30 |
| 2010/0114355 A1 | 5/2010 | Harashima et al. | |
| 2010/0198383 A1 | 8/2010 | Richey | |
| 2010/0235146 A1 * | 9/2010 | Bennett | G06T 17/10 703/1 |
| 2011/0167398 A1 | 7/2011 | Furumoto | |
| 2011/0178787 A1 * | 7/2011 | Patankar | G06F 17/30 703/13 |
| 2011/0179090 A1 * | 7/2011 | Sivaram | G06F 17/30 707/803 |
| 2011/0225183 A1 * | 9/2011 | Rezayat | G06Q 10/10 707/769 |
| 2012/0215730 A1 * | 8/2012 | Collier | G06Q 10/06 706/47 |
| 2013/0080477 A1 | 3/2013 | Evans et al. | |
| 2013/0080478 A1 | 3/2013 | Ben-Haim et al. | |
| 2013/0132373 A1 | 5/2013 | Huang et al. | |
| 2013/0132432 A1 | 5/2013 | Carter et al. | |

OTHER PUBLICATIONS

Bennett, Jeremy S., "Massive Model Visualization: An investigation into spatial partitioning," Masters Thesis, 2009, Iowa State University, pp. 1-74.*

Gecevska, Valentina, et al., "Product Lifecycle Management Through Innovative and Competitive Business Environment," Oct. 2010, Journal of Industrial Engineering and Management (JIEM), vol. 3, Issue 2, pp. 323-336 (14 total pages).*

Sampaio, Marcus C., et al., "Towards a Logical Multidimensional Model for Spatial Data Warehousing and OLAP," Nov. 10, 2006, ACM, DOLAP '06, pp. 83-90 (8 total pages).*

Frehner, Marcel et al., "Virtual database: Spatial analysis in a Web-based data management system for distributed ecological data," Jul. 11, 2006, ElSevier, Environmental Modelling and Software, Issue 21, pp. 1544-1554 (11 total pages).*

Kasik, David, D. Manocha, A. Stephens, B. Bruderlin, P. Slusallek, E. Gobbetti, W. Correa, and I. Quilez. "Real time interactive massive model visualization." Eurographics 2006: Tutorials (2006).*

Kasik et al., "Course Notes : Massive Model Visualization Techniques", 2008 ACM, SIGGRAPH '08 ACM SIGGRAPH 2008 classes, pp. 1-188.*

Kasik, Dave. "Visibility-guided rendering to accelerate 3d graphics hardware performance." In ACM SIGGRAPH 2007 courses, pp. 108-132 (25 total pages), ACM, 2007.*

Deitrich, Andreas, et al., "Massive-Model Rendering Techniques," IEEE Computer Graphics and Applications, Nov./Dec. 2007, IEEE, pp. 20-34 (15 total pages).*

Gobbetti et al., "Technical Strategies for Massive Model Visualization", Proceedings of the 2008 ACM symposium on Solid and Physical Modeling New York 2008, 11pages.

PCT International Search Report dated Feb. 15, 2013 corresponding to PCT Application No. PCT/US2012/065837 filed Nov. 19, 2012 (12 pages).

John C. Hart, "Chapter 11—Procedural Synthesis of Geometry", In: F. Kenton Musgrave, "Texturing & Modeling", ISBN: 1-55860-848-6, 2003, San Francisco, CA, 684 pages.

Rubin et al., "A 3-Dimensional Represenation for Fast Rendering of Complex Scenes", ComputerGraphics Proceedings, Proceedings of Siggraph Annual International Conference on Computer Graphics, vol. 14, No. 3, Jan. 1, 1980, pp. 110-116.

PCT International Search Report dated Feb. 25, 2013 corresponding to PCT Application No. PCT/US2012/066186 filed Nov. 21, 2012 (16 pages).

PCT International Search Report dated Feb. 12, 2013 corresponding to PCT Application No. PCT/US2012/065967 filed Nov. 20, 2012 (14 pages).

"Massive Model 3d Navigation with Right Hemisphere's Deep Vision file format"; Aug. 9, 2011, Printed from internet; http://rhdeepexploration.wordpress.com/2011/08/09/massive-model-3d-navigation-with-right-hemispheres-deep-vision-file-format/; 6 pages.

Kent Tegels, Hierarchy ID, Microsoft Corporation, MSDN Magazine, Sep. 2008, retrieved on Feb. 12, 2014, retrieved from internet <URL:http://msdn.microsoft.com/en-us-magazine/cc794278.aspx> (10 pages).

Estublier et al., Toward SCM/PDM Integration?, University of Grenoble, ECOOP '98 Proceedings of the SCM-8 Syposium on System Configuration Management, 1998, pp. 75-94, retrieved from the Internet <URL: http://pdf.aminer.org/000/578/207/toward__scm_pdm_integration.pdf> (19 pages).

Tom Haughey, Modeling Hierarchies, Association with the Meta-Data and Data Modeling Summit, Jun. 14-16, 2005, retrieved on Feb. 12, 2014, retrieved from the Internet <URL: http://www.tdan.com/view-special-features/5400/> (6 pages).

Koo et al., Feasibility Study of 4D CAD in Commercial Construction, CIFE Technical Report #118, Aug. 1998, retrieved on Feb. 12, 2014, retrieved from the Internet <URL: http://cife.stanford.edu/sites/default/files/TR118.pdf> (135 pages).

Notice of Allowance for U.S. Appl. No. 13/606,555, dated Feb. 18, 2014. (21 pages).

* cited by examiner

MASSIVE MODEL VISUALIZATION WITH SPATIAL RETRIEVAL

CROSS-REFERENCE TO RELATED APPLICATION

This application claims priority to and the benefit of the filing date of India Patent Application 1486/KOL/2011, filed Nov. 23, 2011, which is hereby incorporated by reference. This application also includes some subject matter in common with concurrently-filed application Ser. No. 13/606,590 for "Massive Model Visualization in PDM Systems," now U.S. Pat. No. 9,053,254, and Ser. No. 13/606,555 for "Massive Model Visualization with Spatial Indexing," U.S. Pat. No. 8,725,763, which are hereby incorporated by reference.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include systems and methods for improved PDM processes. A method includes storing a hierarchical product data structure by a product data management (PDM) system. The hierarchical product data structure includes a plurality of occurrence nodes and component nodes. The component nodes include a cell index value for a corresponding product component that identifies the product component's spatial location according to defined cells of a three-dimensional model of the product assembly. The method includes receiving a query that references an occurrence node and at least one cell index value and determining a query result corresponding to the query. The query result identifies at least one occurrence node that corresponds to the cell index value. The method includes forming a query result chain corresponding to the query result, the query result chain filtered by a structural criterion, and applying a configuration rule to the filtered query result chain to identify child nodes of the filtered query result chain that conform to the configuration rule, and thereby producing a configured spatial retrieval result.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Massive Model Visualization (MMV) systems are able to render models with millions of parts by identifying the (typically small) subset of part occurrences that is actually needed to produce a correct image. Visibility-guided rendering (VGR) algorithms traverse a pre-computed spatial structure in order to determine which occurrences are potentially visible from a given eye point in an efficient manner.

It is a valuable and typical practice to model products, factories and other complex entities composed of many constituents into a hierarchical structure of reusable elements. Examples of reusable elements include parts and assemblies, logical systems, fasteners, welds, and factory cells. A single element can be instantiated many different times in a structure. Each instantiation represents a different usage of the same identically defined element and is referred to as an "occurrence" of that element. For example, a car may have four identical wheels. There is a single definition of the wheel, but it is instantiated four times in the product structure of that car. There are, therefore, four wheel occurrences in the car corresponding to the front left, front right, rear left, and rear right wheels; each of these occurrences can also have geometric or spatial information indicating the location of the element in the vehicle.

The ability to model each occurrence explicitly and associate unique data to it while retaining the cohesiveness of the common definition element has been one of the key innovations in product structure management in recent years. The powerful features supported by an occurrence based model include the ability to define and scope specific information about the usage of an element to the exact context it applies and to work within nested contexts that override data from lower level to higher level contexts. An occurrence, as used herein, represents a path through such a product data model of an assembly to a specific node in its proper context, including all parent nodes.

Figure 1:
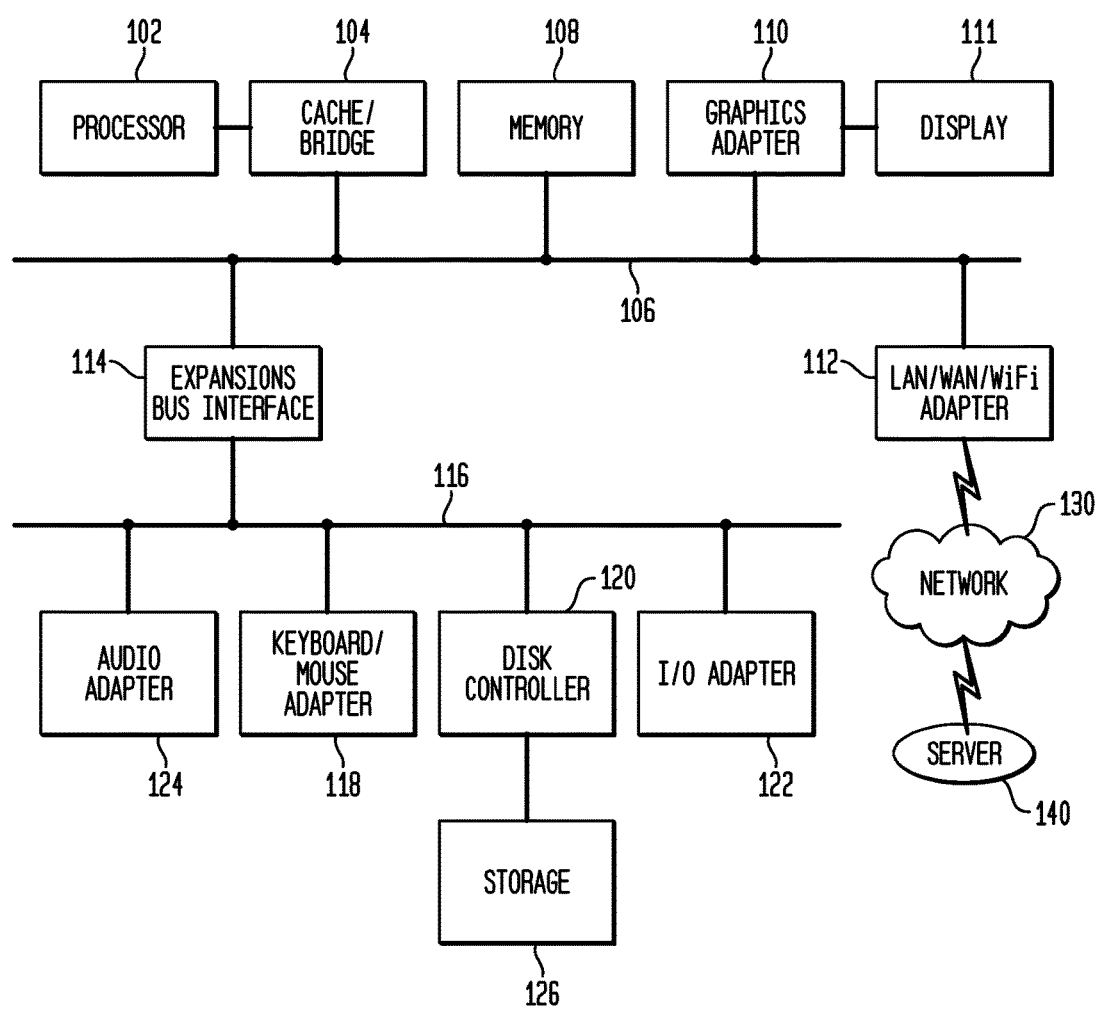
FIG. 1 depicts a block diagram of a data processing system in which an embodiment can be implemented.

FIG. 1 depicts a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments include a PDM system, method, and apparatus for spatial and structural based information retrieval for dynamic configuration systems on hierarchical BOM structures. In PDM a product program can be persisted in the database as a collection of BOM lines, organized hierarchically to reflect the structural design relation between different product components. The persisted product data forms the superset of the design information about each product in the program including all design variants and the entire design history.

The concrete design of a particular "version" of a particular product model is made available to a client user by a configuration system, running at the server side, which applies configuration logic based on given configuration rules to the persisted product information and sends the configured structure to the client.

The configuration system as it exists today is capable of generating a configured structure for the whole product. As discussed herein, disclosed embodiments also enable efficient information retrieval with given spatial and structural criteria. Examples of such information retrieval include "get all the configured occurrences located in this spatial region and belonging to this product component" or "get the bounding box information of a given product component".

One important performance aspect of some embodiments is that the information retrieval is achieved by filtering out occurrences using database queries based on spatial and structural criteria such that only the occurrences that can contribute to the visual display are configured and therefore the cost to perform configuration logic is minimized.

Figure 2:
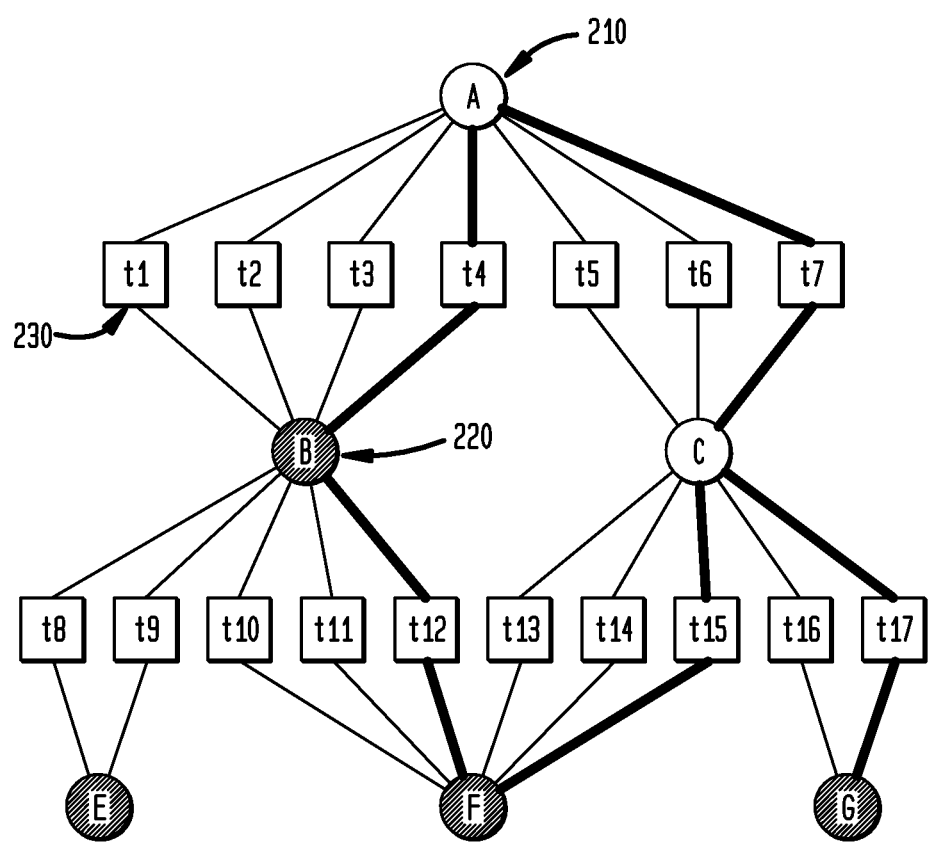
FIG. 2 shows a conceptual illustration of a persisted and configured hierarchical data product structure of an example product in accordance with disclosed embodiments.

FIG. 2 shows a conceptual illustration of persisted and configured hierarchical data product structure of an example product. In this example, unshaded circles, such as node A 210, represent component nodes with no geometry. Shaded circles, such as node B 220, represent components nodes with geometry. Squares, such as occurrence t1 230, represent occurrence nodes. Each non-leaf component node may have one or more occurrence nodes as its children, where each occurrence node carries a transform matrix that defines the positioning of the component it points to. Some component nodes contain geometric information as part of its definition. The collection of all component geometry, when properly transformed placed into a desired coordinate system, forms the geometric definition of the product and determines what the product looks like when it is visualized. Each component node with geometry definition can be described either from spatial perspective, i.e., where it is relative to the entire product geometry, or from structural perspective, i.e., how to traverse the hierarchical structure from the product root node to the component node. The spatial perspective refers to the representation of the component's physical positioning with respect to the other components and the assembly as a whole.

In FIG. 2, for this example, assume that occurrences t1, t5, t8, t10, t13, and t16 are occurrences in a revision A; occurrences t2, t6, t9, t11, t14, and t17 are occurrences in a revision B; occurrences t3, t7, t12, and t15 are occurrences in a revision C; and occurrence t4 are an occurrence in a revision D. Connecting lines (or edges) represent unconfigured relations, while the bolded/heavy lines represent configured relations.

The component nodes can include a cell index value for a corresponding product component that identifies the product component's spatial location according to defined cells of a three-dimensional model of the product assembly.

The configuration system as it exists today is capable of generating a configured structure for the whole product. The configured structure of FIG. 2 illustrates an exemplary configuration rule "Latest Revision" using the bolded lines. The revisions A-D described above are based on exemplary revision attributes. Note that the techniques described herein are effective with any configuration rule, not only "Latest Revision" configuration rule used for illustration purposes.

Each non-leaf component node may have one or more occurrence nodes as its children, as illustrated, where each occurrence node carries a transform matrix that defines the positioning of the component it points to. Some component nodes contain geometric information as part of its definition. The collection of all component geometry, when properly transformed into the world coordinate system, forms the geometric definition of the product and determines what the product looks like when it is visualized. Each component node with geometry definition can be described either from spatial perspective, i.e., where it is relative to the entire product geometry, or from structural perspective, i.e., how to traverse the hierarchical structure from the product root node to the component node.

The spatial description of each geometric component can be concisely defined by an integer index based on any chosen type of spatial partitioning of the product bounding box into a set of hierarchical cells, while the structural description can be derived from the hierarchical structure definition. One specific example of such an index is described in the related patent document incorporated herein, but other spatial index systems could be used.

In various embodiments, a database table is used from the hierarchical structure to keep track of the spatial description for each distinct instance of every geometric component.

Conceptually, a PDM system as described herein implements a configuration engine which performs a configuration operation. Such an operation can be abstracted as "choosing a subset of child occurrences from the given set of persisted occurrence children for the parent component".

Figure 3:
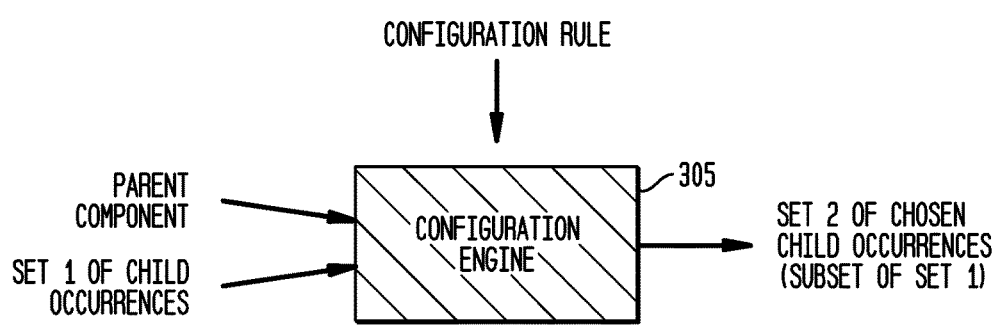
FIG. 3 shows a simplified block diagram of a configuration process performed by a configuration engine in accordance with disclosed embodiments.

FIG. 3 shows a simplified block diagram of such a process. Configuration engine 305 can receive a parent component and a first set of child occurrences. Configuration engine can receive and apply one or more configuration rules, and based on these inputs, can produce a second set of child occurrences. This second set of child occurrences can be a subset of the first set, and reflects the child occurrences that conform to the configuration rule. This process can use various different configuration rules, including but not limited to revision rules and variant rules.

Disclosed embodiments can use an "equivalent occurrence group" to achieve more compact indexing representation. Two occurrences are considered "equivalent" if they connect the same parent component and the same child component and that if their transform matrices, representing their spatial locations, are considered sufficiently close to each other as measured by a distance threshold δ. If the distance threshold δ is set to be zero, then the transform matrices are required to be identical for two occurrences to be equivalent to each other. All occurrences that are equivalent to each other form an equivalent occurrence group.

Within each equivalent occurrence group, one occurrence is chosen or designated to be an "anchor occurrence" and all the other occurrences are called "equivalent occurrences". An occurrence chain is a chain of occurrences linked in the hierarchical data structure; an occurrence chain that consists of only anchor occurrences is called an "anchor occurrence chain".

Disclosed embodiments can also represent all occurrence equivalence relations in a secondary table. The cell index of an anchor occurrence chain is decided by the combined bounding box of all the equivalent occurrence chains in the world coordinate system. That is, a bounding box is determined that corresponds to the geometric bounds of all the equivalent occurrence chains, and the corresponding cell index (or indices) for the bounding box is used for the anchor occurrence chain. In the special case when distance threshold δ is set to be zero, only the bounding box of the anchor occurrence chain needs be considered since the bounding boxes of all its equivalent occurrence chains are identical.

Figure 4:
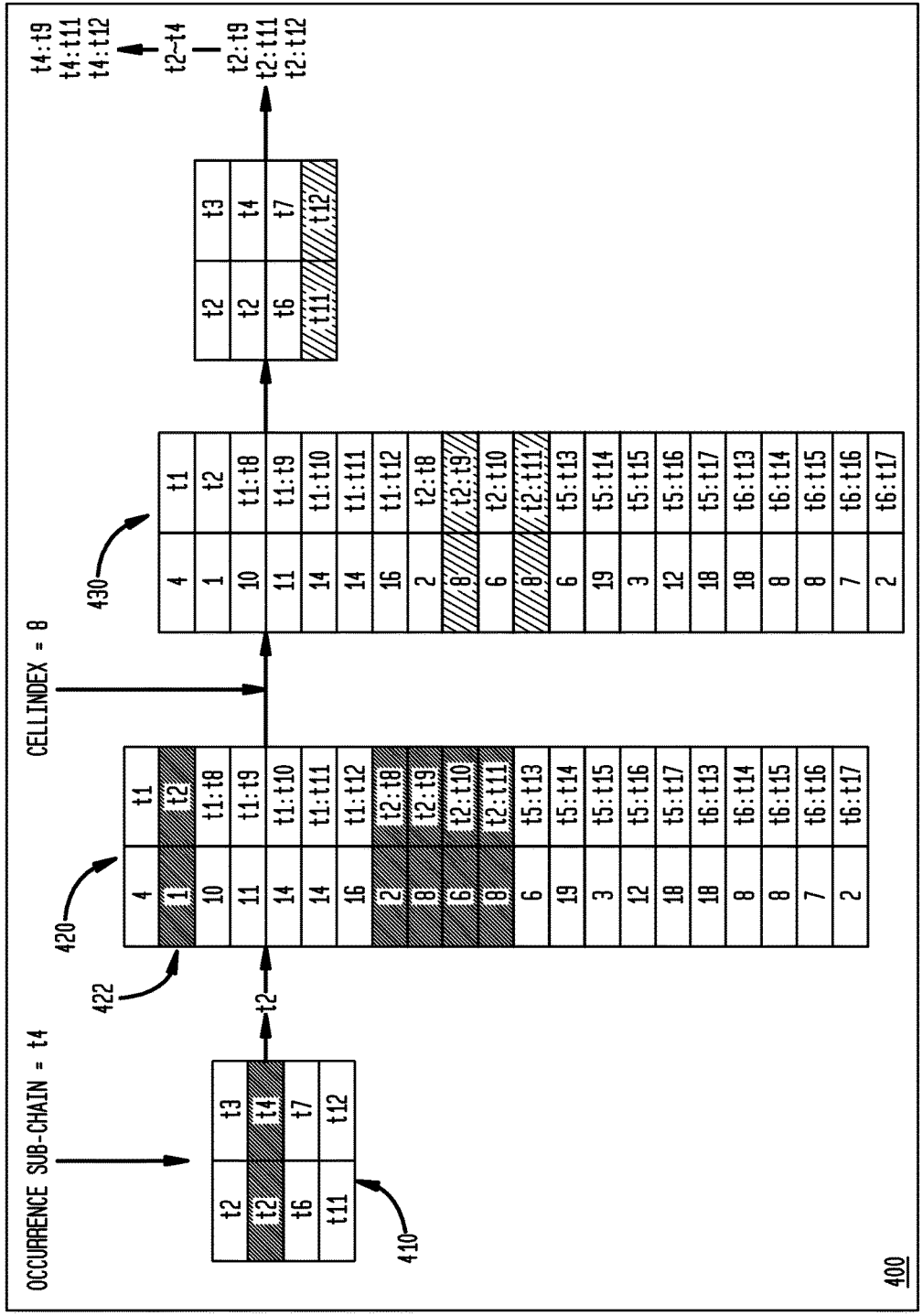
FIG. 4 illustrates various data structures stored in and maintained by a PDM data processing system in accordance with disclosed embodiments.

FIG. 4 illustrates various data structures stored in and maintained by a PDM data processing system 400, operating on data as shown in FIG. 2. In this example, assuming that there are three equivalent occurrence groups in the example structure shown in FIG. 2: {t2, t3, t4}, {t6, t7}, and {t11, t12}.

FIG. 4 illustrates an occurrence equivalency table 410 showing equivalency between the anchor occurrences in the left column and the equivalent occurrences, corresponding to each of the anchor occurrences, in the right column. In occurrence equivalency table 410, it is assumed that t2, t6, and t11 are chosen to be anchor occurrences in their respective groups, so t2 is shown as the anchor occurrence to its equivalents t3 and t4, t6 is shown as the anchor occurrence to equivalent t7, and t11 is shown as the anchor occurrence to equivalent t12.

FIG. 4 also illustrates an anchor occurrence table 420, that functions as a spatial index table to show, in the left column, a spatial index value that corresponds to the occurrences (or occurrence chains) shown in the right column. Anchor occurrence table 420 is compact in that, for example, the row at 422 indicates that cell index 1 corresponds to anchor occurrence t2, without also requiring additional rows to specify that cell index 1 also corresponds to equivalent occurrences t3 and t4.

Also shown in FIG. 4 is an example of queries that can be performed using occurrence equivalency table. Each occurrence node in the occurrence chain must be queried in the occurrence equivalency table first to identify the corresponding anchor occurrence before the formulated anchor occurrence chain is queried in the occurrence table.

FIG. 4 also illustrates an example of retrieving all the components based on structural criterion, i.e. all components belonging to occurrence sub-chain t4. In this case, the system must first query the occurrence equivalency table 410 to determine that t4 is listed as an equivalent with t2 as its anchor occurrence. Anchor occurrence table 420 is then queried using anchor occurrence t2. In anchor occurrence table 420, the shaded cells illustrate the cells that have occurrence t2 in the occurrence chain reflected in the second column, and the corresponding cell index is shown in the first column. A query of the anchor occurrence table 420 for occurrence t2—the anchor occurrence of equivalent occurrence t4—would return occurrence chains t2, t2:t8, t2:t9, t2:t10, and t2:t11. In returning the results, the system can also again expand any equivalents and convert the results back to reference the original queried occurrence. That is, from the set of result above, the system can convert the t2 references back to t4, and add the occurrence chain t2:12, since it is the equivalent of the t2:11 occurrence chain. The returned results can therefore be t4, t4:t8, t4:t9, t4:t10, t4:t11, and t4:t12.

Additionally, FIG. 4 illustrates how the query can be refined by an additional spatial criterion such that all instances that both belong to assembly t4 and are located in cell 8 are identified. The initial lookup to the occurrence equivalency table 410 is as described above, and the query to the anchor occurrence table 430 also specifies that the cell index is 8. Such a query would return occurrence chains t2:t9 and t2:t11. As above, the t2 can be converted back to t4, and another lookup to anchor occurrence table 420 indicates that t12 is an equivalent of t11, so the final returned result can be t4:t9, t4:t11, and t4:t12.

Figure 5:
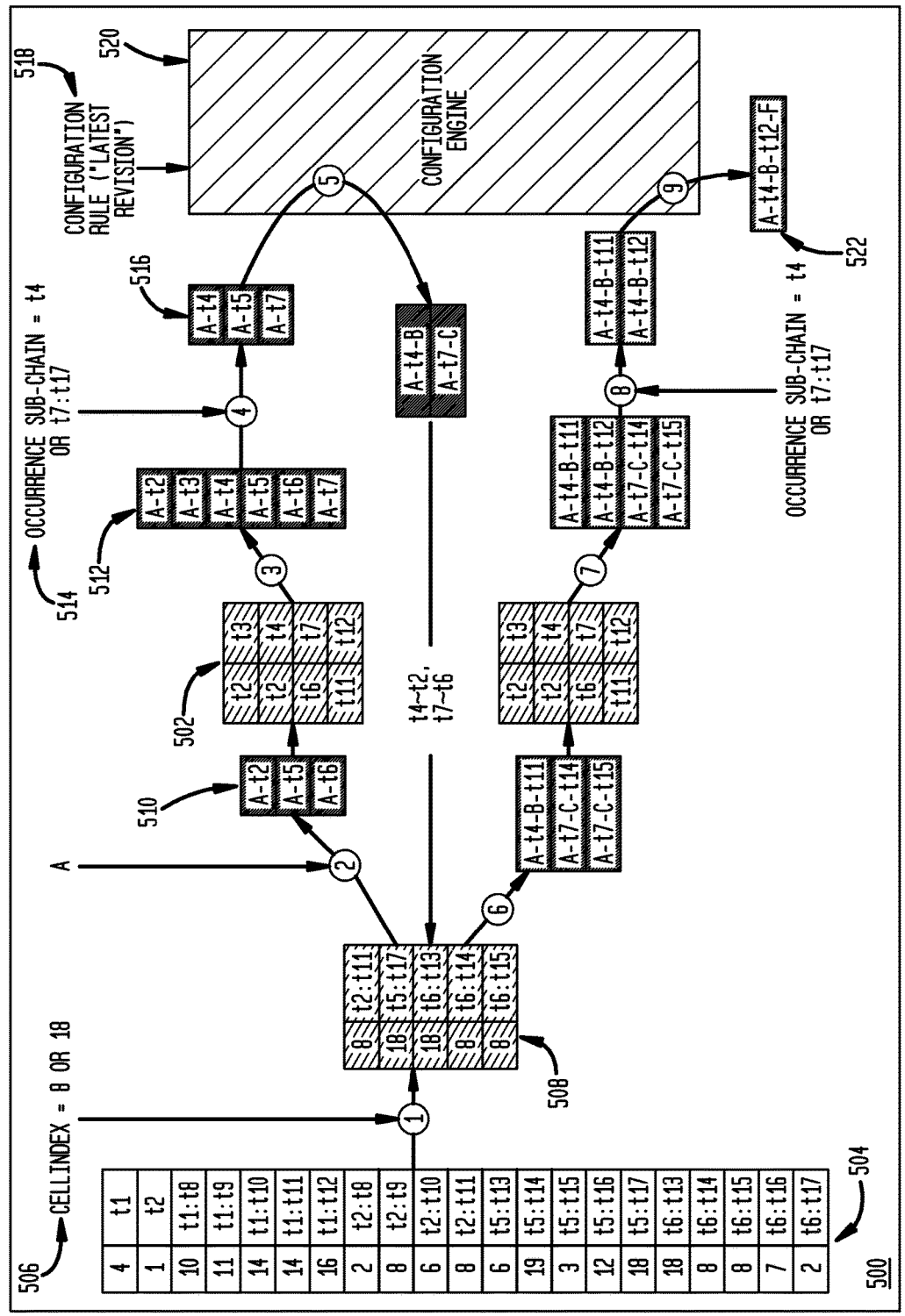
FIG. 5 depicts a logic diagram of the extended configuration system that performs a sample spatial request, in accordance with disclosed embodiments.
Figure 6:
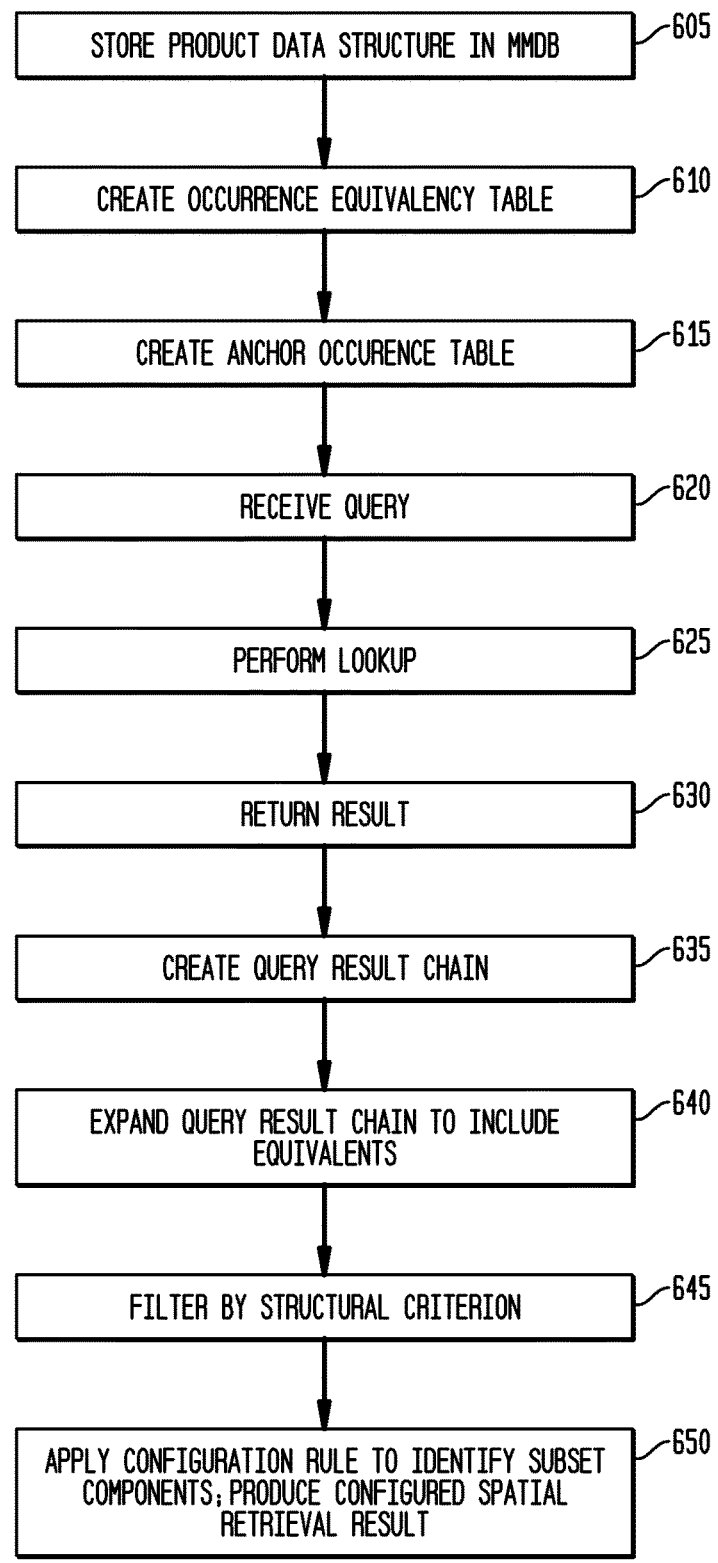
FIG. 6 depicts a flowchart of a process in accordance with disclosed embodiments.

FIG. 5 depicts a logic diagram 500 of the extended configuration system that performs a sample spatial request; FIG. 6 is a flowchart of a corresponding process in accordance with disclosed embodiments that can be performed by a PDM system as described herein.

In this example, the sample request is chosen to be "retrieve all configured occurrences that are located in cell 8 or 18 and that belongs to occurrence chain t4 or t7:t17". The illustration assumes the anchor occurrence table and occurrence equivalency table definition shown in FIG. 4.

Initially, the system stores a hierarchical product data structure (step 605), such as in a massive model database. The product data structure preferably represents a product assembly, and can include interconnected nodes representing components with no included geometric information, nodes representing components with geometric information, and occurrence nodes. The geometric information can include a cell index value for the corresponding component that identifies the component's spatial location according to defined cells of a three-dimensional model of the product assembly.

The system creates an occurrence equivalency table (step 610), such as that illustrated as table 502. The occurrence equivalency identifies at least one anchor occurrence node, and identifies at least one equivalent occurrence node that connects a same parent component node and a same child component node as the anchor occurrence node, and that is spatially located within a specified distance threshold of the anchor occurrence node. The equivalent occurrence node can be considered spatially located within a specified distance threshold of the anchor occurrence node if its transform matrix is within the threshold distance. The system can store the occurrence equivalency table.

The system creates an anchor occurrence table corresponding to the hierarchical product data structure (step 615), such as that illustrated as table 504. This step can include identifying each unique occurrence chain in the hierarchical product data structure, where each equivalent occurrence node is replaced by its corresponding anchor occurrence node. The anchor occurrence table associates each identified unique occurrence chain with an associated cell index value. The system can store the anchor occurrence table.

The system can receive a query (step 620), such as shown at 506. The query can reference an occurrence node, and can reference a cell index value.

The system can perform a lookup process on the occurrence equivalency table and anchor occurrence table according to the query (step 625). As part of this step, the system can query the anchor occurrence table by a spatial criterion to get all the occurrences that are located in cell indices according to the criterion; cell 8 or 18, in this example. This is shown at circle 1 in FIG. 5.

The system can return a query result corresponding to the query (step 630), as shown at 508.

The system can take the root node of the product, such as root A node 210 as shown in FIG. 2 and shown at circle 2 in FIG. 5, and put it in parallel with all its unique anchor occurrence children retrieved in the query result at 508 (step 635). This can produce query result chain 510.

The system can query the occurrence equivalency table 502 to expand the query result chain, including child occurrences of A, that need be configured based on the equivalency relations defined in the occurrence equivalency table (step 640), as shown at circle 3. This can produce expanded query result chains 512.

The system can apply a structural criterion 514, as shown at circle 4, to filter out those children nodes of A that are not of interest (step 645). The structurally-filtered query result chains are shown at 516. The structural criterion can identify one or more occurrence nodes or subchains that must be present in the query result chain.

The system can apply configuration rule 518 using a configuration engine 520 to figure out the subset of children occurrences of A based on the configuration rule (step 650), which in this case are occurrences t4 and t7. As part of this step, the system can identify the component nodes, B and C, to which the survived children occurrences of A (t4 and t7) point. This step can identify child nodes of the filtered query result chains that conform to the configuration rule. That is, the configuration engine 520 can take as input the parent node A and the first subset of child occurrences identified by the query result chain, apply the configuration rules, and produce the second subset of child occurrences or nodes that satisfy the configuration rule and are children of the first subset of child occurrences.

An advantage of this process is that the configuration rule is only applied to those occurrence nodes and chains that have already satisfied spatial constraints, and so the system is not required to apply configuration rules to the entire product structure. The configuration rule can be received from a user, another device or process, or otherwise.

The system can then recursively repeat steps 625-650 for each of the children components nodes, while there are still any children nodes, until it produces the configured spatial retrieval result shown at 522.

In this example, the system can retrieve the next level of children occurrences of the B and C, with equivalency relation considered, shown at circle 6. Similar to the process at circle 3, the system can expand the child occurrences of B and C based on the equivalency relation, as shown a circle 7. Similar to the process shown at circle 4, the system can apply structural criteria to filter out those children of B and C that are not of interest, as shown at circle 8. Similar to the process as shown at circle 5, the system can apply the configuration rule using the configuration engine to identify subset of children occurrences of B and C based on the configuration rule, as shown at circle 9.

The result of such a process is the configured spatial retrieval result as shown at 522.

The configured spatial retrieval result can then be displayed, stored, or otherwise used, including displaying a three-dimensional representation of a portion of the product represented by the product data structure, where the portion includes the components identified by the configured spatial retrieval result (and in certain cases, only those components).

Disclosed embodiments can also be used to display a three-dimensional thumbnail for a chosen component (leaf or non-leaf). Various embodiments provide advantages in the way a system handles the "spatially or structurally constrained" configuration, Note that in other embodiments, where occurrence equivalencies are not considered, the process of FIG. 6 can be simplified to a recursive process of identifying the parent component and a first set of child occurrences (typically the children of the root node in the first pass) from the spatial query, then applying a configuration rule to these to identify a second set of child occurrences (which will be a subset or children of one or more of the occurrences in the first set). When there are no more children sets to be considered, the system assembles the result, which consists of chains of connected component nodes and occurrences, into the configured spatial retrieval result.

The system can recursively perform the forming and applying processes, using the identified child nodes, until no further child nodes are identified, and then stores a combined configured spatial retrieval result.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for massive-model visualization, comprising:
    storing a hierarchical product data structure by a product data management (PDM) system, the hierarchical product data structure including a plurality of occurrence nodes and component nodes, the component nodes including a cell index value for a corresponding product component that identifies the product component's spatial location according to defined cells of a three-dimensional model of the product assembly;
    receiving a query that references an occurrence node and at least one cell index value;
    determining a query result corresponding to the query, by the PDM system, the query result identifying at least one occurrence node that corresponds to the cell index value;
    forming a query result chain corresponding to the query result, the query result chain filtered by a structural criterion;
    applying a configuration rule to the filtered query result chain, by the PDM system, to identify child nodes of the filtered query result chain that conform to the configuration rule, and thereby producing a configured spatial retrieval result, wherein the configuration rule is only applied to occurrence nodes and occurrence chains that have already satisfied spatial constraints; and
    storing the configured spatial retrieval result.

2. The method of claim 1, wherein the PDM system receives performs a lookup process on an occurrence equivalency table and anchor occurrence table, and determines the query result that identifies occurrence chains corresponding to the query.

3. The method of claim 2, wherein the PDM system also creates the occurrence equivalency table, from the hierarchical product data structure, that identifies at least one anchor occurrence node, and identifies at least one equivalent occurrence node that connects a same parent component node and a same child component node as the anchor occurrence node, the product component corresponding to the equivalent occurrence node being spatially located within a specified distance threshold of product component corresponding to the anchor occurrence node; and
    creates the anchor occurrence table, corresponding to the hierarchical product data structure, that lists a plurality of unique occurrence chain represented by the hierarchical product data structure, where each equivalent occurrence node is replaced by its corresponding anchor occurrence node, and that associates each listed unique occurrence chain with an associated cell index value; and stores the occurrence equivalency table and anchor occurrence table in the PDM system.

4. The method of claim 2, wherein the PDM system expands the query result chain based on an equivalency relation defined in the occurrence equivalency table.

5. The method of claim 1, wherein the PDM system recursively performs the forming and applying processes, using the identified child nodes, until no further child nodes are identified, and then stores a combined configured spatial retrieval result.

6. The method of claim 1, wherein the PDM system displays a three-dimensional representation of a portion of a product represented by the product data structure, where the portion includes the components identified by the configured spatial retrieval result.

7. A product data management (PDM) system comprising:
at least one processor; and
an accessible memory, the PDM system configured to:
store a hierarchical product data structure by a product data management (PDM) system, the hierarchical product data structure including a plurality of occurrence nodes and component nodes, the component nodes including a cell index value for a corresponding product component that identifies the product component's spatial location according to defined cells of a three-dimensional model of the product assembly;
receive a query that references an occurrence node and at least one cell index value;
determine a query result corresponding to the query, the query result identifying at least one occurrence node that corresponds to the cell index value;
form a query result chain corresponding to the query result, the query result chain filtered by a structural criterion,
apply a configuration rule to the filtered query result chain to identify child nodes of the filtered query result chain that conform to the configuration rule, and thereby producing a configured spatial retrieval result, wherein the configuration rule is only applied to occurrence nodes and occurrence chains that have already satisfied spatial constraints; and
store the configured spatial retrieval result.

8. The PDM system of claim 7, wherein the PDM system receives performs a lookup process on an occurrence equivalency table and anchor occurrence table, and determines the query result that identifies occurrence chains corresponding to the query.

9. The PDM system of claim 8, wherein the PDM system also
creates the occurrence equivalency table, from the hierarchical product data structure, that identifies at least one anchor occurrence node, and identifies at least one equivalent occurrence node that connects a same parent component node and a same child component node as the anchor occurrence node, the product component corresponding to the equivalent occurrence node being spatially located within a specified distance threshold of product component corresponding to the anchor occurrence node; and
creates the anchor occurrence table, corresponding to the hierarchical product data structure, that lists a plurality of unique occurrence chain represented by the hierarchical product data structure, where each equivalent occurrence node is replaced by its corresponding anchor occurrence node, and that associates each listed unique occurrence chain with an associated cell index value; and stores the occurrence equivalency table and anchor occurrence table in the PDM system.

10. The PDM system of claim 8, wherein the PDM system expands the query result chain based on an equivalency relation defined in the occurrence equivalency table.

11. The PDM system of claim 7, wherein the PDM system recursively performs the forming and applying processes, using the identified child nodes, until no further child nodes are identified, and then stores a combined configured spatial retrieval result.

12. The PDM system of claim 7, wherein the PDM system displays a three-dimensional representation of a portion of a product represented by the product data structure, where the portion includes the components identified by the configured spatial retrieval result.

13. A non-transitory computer-readable medium encoded with computer-executable instructions that, when executed, cause a product data management (PDM) system to:
store a hierarchical product data structure by a product data management (PDM) system, the hierarchical product data structure including a plurality of occurrence nodes and component nodes, the component nodes including a cell index value for a corresponding product component that identifies the product component's spatial location according to defined cells of a three-dimensional model of the product assembly;
receive a query that references an occurrence node and at least one cell index value;
determine a query result corresponding to the query, the query result identifying at least one occurrence node that corresponds to the cell index value;
form a query result chain corresponding to the query result, the query result chain filtered by a structural criterion,
apply a configuration rule to the filtered query result chain to identify child nodes of the filtered query result chain that conform to the configuration rule, and thereby producing a configured spatial retrieval result, wherein the configuration rule is only applied to occurrence nodes and occurrence chains that have already satisfied spatial constraints; and
store the configured spatial retrieval result.

14. The computer-readable medium of claim 13, wherein the PDM system receives performs a lookup process on an occurrence equivalency table and anchor occurrence table, and determines the query result that identifies occurrence chains corresponding to the query.

15. The computer-readable medium of claim 14, wherein the PDM system also
creates the occurrence equivalency table, from the hierarchical product data structure, that identifies at least one anchor occurrence node, and identifies at least one equivalent occurrence node that connects a same parent component node and a same child component node as the anchor occurrence node, the product component corresponding to the equivalent occurrence node being spatially located within a specified distance threshold of product component corresponding to the anchor occurrence node; and
creates the anchor occurrence table, corresponding to the hierarchical product data structure, that lists a plurality of unique occurrence chain represented by the hierarchical product data structure, where each equivalent occurrence node is replaced by its corresponding anchor occurrence node, and that associates each listed unique occurrence chain with an associated cell index value; and stores the occurrence equivalency table and anchor occurrence table in the PDM system.

16. The computer-readable medium of claim 14, wherein the PDM system expands the query result chain based on an equivalency relation defined in the occurrence equivalency table.

17. The computer-readable medium of claim 13, wherein the PDM system recursively performs the forming and applying processes, using the identified child nodes, until no further child nodes are identified, and then stores a combined configured spatial retrieval result.

18. The computer-readable medium of claim 13, wherein the PDM system displays a three-dimensional representation of a portion of a product represented by the product data structure, where the portion includes the components identified by the configured spatial retrieval result.

* * * * *